US012696540B2

(12) United States Patent
Feng et al.

(10) Patent No.: US 12,696,540 B2
(45) Date of Patent: Jul. 28, 2026

(54) ARRAY SUBSTRATE, DISPLAY PANEL, AND DISPLAY DEVICE

(71) Applicants: Hefei BOE Joint Technology Co., Ltd., Hefei (CN); BOE Technology Group Co., Ltd., Beijing (CN)

(72) Inventors: Xuehuan Feng, Beijing (CN); Yongqian Li, Beijing (CN)

(73) Assignees: Hefei BOE Joint Technology Co., Ltd., Hefei (CN); BOE Technology Group Co., Ltd., Beijing (CN)

( * ) Notice: Subject to any disclaimer, the term of this patent is extended or adjusted under 35 U.S.C. 154(b) by 384 days.

(21) Appl. No.: 18/293,316

(22) PCT Filed: Aug. 22, 2022

(86) PCT No.: PCT/CN2022/114050
§ 371 (c)(1),
(2) Date: Jan. 29, 2024

(87) PCT Pub. No.: WO2024/040405
PCT Pub. Date: Feb. 29, 2024

(65) Prior Publication Data
US 2025/0113613 A1     Apr. 3, 2025

(51) Int. Cl.
*G02F 1/1333*          (2006.01)
*G09G 3/20*            (2006.01)
(Continued)

(52) U.S. Cl.
CPC ......... *H10D 86/443* (2025.01); *G09G 3/2092* (2013.01); *G09G 2300/0408* (2013.01); *G09G 2310/0267* (2013.01)

(58) Field of Classification Search
CPC ............... G02F 1/1333; G09G 3/2092; G09G 2300/0408; G09G 2310/0267;
(Continued)

(56) References Cited

U.S. PATENT DOCUMENTS 12,174,478 B2 * 12/2024 Xie ................... G02F 1/134309
2012/0054141 A1    3/2012 Mizuguchi et al.
(Continued)

FOREIGN PATENT DOCUMENTS

CN          1917019 A      2/2007
CN        108022553 A      5/2018
(Continued)

*Primary Examiner* — Omar F Mojaddedi
(74) *Attorney, Agent, or Firm* — IPro, PLLC

(57) ABSTRACT

Provided is an array substrate, including: a gate drive circuit disposed in a non-display region of a base substrate; a plurality of display pads disposed in a bonding region of the base substrate, wherein the plurality of display pads include gate drive signal pads, data signal pads, and voltage signal pads which are arranged in sequence in a first direction; and a plurality of gate connection wirings disposed in the non-display region of the base substrate, wherein a quantity of the gate connection wirings is greater than a quantity of the gate drive signal pads, wherein first ends of the gate connection wirings are electrically connected to the gate drive circuit, with second ends of one part of the gate connection wirings electrically connected to the gate drive signal pads and second ends of another part of the gate connection wirings electrically connected to the voltage signal pads.

20 Claims, 3 Drawing Sheets

(51) Int. Cl.
  *H10D 86/00*         (2025.01)
  *H10D 86/40*         (2025.01)
  *H10D 86/60*         (2025.01)
(58) Field of Classification Search
  CPC .... H10D 86/443; H10D 86/441; H10D 86/60;
                                                H10D 86/00
  See application file for complete search history.

(56)                    References Cited

U.S. PATENT DOCUMENTS

2014/0063429 A1*   3/2014  Huh .................. G02F 1/134309
                                                            349/139
2016/0246132 A1*   8/2016  Cho .................. G02F 1/134309
2018/0122302 A1    5/2018  Koong
2018/0314118 A1*  11/2018  Itou ..................... G02F 1/13439
2019/0353940 A1*  11/2019  Zhao ................. G02F 1/136286
2021/0074196 A1    3/2021  Feng et al.
2023/0402464 A1*  12/2023  Zhang ................. H10D 86/441

FOREIGN PATENT DOCUMENTS

CN       110518022  A    11/2019
CN       114815359  A    7/2022
CN       216958034  U    7/2022

* cited by examiner

ARRAY SUBSTRATE, DISPLAY PANEL, AND DISPLAY DEVICE

CROSS-REFERENCE TO RELATED APPLICATION

This application is a U.S. national phase application based on PCT/CN2022/114050, filed on Aug. 22, 2022, the content of which is incorporated herein by reference in its entirety.

TECHNICAL FIELD

The present disclosure relates to the field of display technologies, and in particular, relates to an array substrate, a display panel, and a display device.

BACKGROUND

In a display industry, to reduce the material cost of a display device and realize a narrow-frame design of the display device, more gate drive circuits adopt a gate driver on array (GOA, namely the gate drive circuits are integrated on an array substrate) technology.

A GOA signal line of a GOA circuit may be connected to a source integrated circuit (IC) through a propel link gate (PLG) wiring to receive a signal output by the source IC.

SUMMARY

Embodiments of the present disclosure provide an array substrate, a display panel, and a display device. The technical solutions are as follows.

In an aspect, the embodiments of the present disclosure provide an array substrate, including:

a base substrate, including a display region and a non-display region surrounding the display region, wherein the non-display region is provided with a bonding region;

a gate drive circuit disposed in the non-display region of the base substrate;

a plurality of display pads disposed in the bonding region of the base substrate, wherein the plurality of display pads and the gate drive circuit are respectively disposed on adjacent sides of the base substrate; the plurality of display pads include gate drive signal pads, data signal pads, and voltage signal pads which are arranged in sequence in a first direction pointing from one side of the gate drive circuit to a side opposite to the gate drive circuit; and a plurality of gate connection wirings disposed in the non-display region of the base substrate, wherein a quantity of the gate connection wirings is greater than a quantity of the gate drive signal pads, wherein first ends of the gate connection wirings are all electrically connected to the gate drive circuit, with second ends of one part of the gate connection wirings electrically connected to the gate drive signal pads and second ends of another part of the gate connection wirings electrically connected to the voltage signal pads.

In some embodiments, in the above array substrate provided according to the embodiments of the present disclosure, the voltage signal pads electrically connected to the second ends of the another part of the gate connection wirings are arranged immediately adjacent to the data signal pads.

In some embodiments, in the above array substrate provided according to the embodiments of the present disclosure, the display region includes data lines, sensing lines, first power lines, and second power lines, wherein the data lines and the sensing lines are electrically connected to the data signal pads, respectively; the first power lines and the second power lines are electrically connected to the voltage signal pads; and the voltage signal pads electrically connected to the first power lines and the second power lines are different from the voltage signal pads electrically connected to the second ends of the another part of the gate connection wirings.

In some embodiments, in the above array substrate provided according to the embodiments of the present disclosure, the second ends of the another part of the gate connection wirings are electrically connected to the voltage signal pads through jumper wirings, wherein the jumper wirings extend along the first direction and are disposed between the plurality of display pads and the display region, and the jumper wirings and the another part of the gate connection wirings are arranged in different layers in an insulation manner.

In some embodiments, in the above array substrate provided according to the embodiments of the present disclosure, the array substrate includes a first metal layer, a second metal layer, and a transparent conductive layer which are stacked on the base substrate, wherein the jumper wirings are disposed on the transparent conductive layer;

the another part of the gate connection wirings are disposed on the first metal layer or the second metal layer;

or, the another part of the gate connection wirings include a first portion and a second portion which are stacked, wherein an orthographic projection of the first portion on the base substrate is overlapped with an orthographic projection of the second portion on the base substrate; the first portion and the second portion are electrically connected to each other through a via hole provided in an overlapping position; the first portion is disposed on the first metal layer, and the second portion is disposed on the second metal layer.

In some embodiments, in the above array substrate provided according to the embodiments of the present disclosure, the one part of the gate connection wirings are electrically connected to input signal lines of the gate drive circuit, and the another part of the gate connection wirings are electrically connected to output ends of the gate drive circuit.

In some embodiments, in the above array substrate provided according to the embodiments of the present disclosure, the jumper wirings are electrically connected to the voltage signal pads through first connection lines, wherein the first connection lines are disposed on the transparent conductive layer or in the first metal layer.

In some embodiments, in the above array substrate provided according to the embodiments of the present disclosure, the one part of the gate connection wirings include a third portion and a fourth portion which are stacked, wherein an orthographic projection of the third portion on the base substrate is overlapped with an orthographic projection of the fourth portion on the base substrate; the third portion and the fourth portion are electrically connected to each other through a via hole provided in an overlapping position; the third portion is disposed on the first metal layer; and the fourth portion is disposed on the second metal layer.

In some embodiments, in the above array substrate provided according to the embodiments of the present disclosure, the first power lines are all electrically connected to second connection lines, wherein the second connection lines extend along the first direction, are disposed between the jumper wirings and the display region, and are disposed on the transparent conductive layer.

In some embodiments, in the above array substrate provided according to the embodiments of the present disclosure, the second power lines are all electrically connected to third connection lines, wherein the third connection lines extend along the first direction, are disposed between the second connection lines and the display region, and are disposed on the first metal layer.

In some embodiments, in the above array substrate provided according to the embodiments of the present disclosure, the bonding region further includes a plurality of test pads disposed on one side of the display pads distal from the display region, wherein the plurality of test pads include gate drive signal test pads, data signal test pads, and voltage signal test pads which are arranged in sequence in the first direction;

wherein the gate drive signal test pads are electrically connected to the gate drive signal pads through first test lines; the data signal test pads are electrically connected to the data signal pads through second test lines; and the voltage signal test pads are electrically connected to the voltage signal pads through third test lines.

In some embodiments, in the above array substrate provided according to the embodiments of the present disclosure, the first test lines, the second test lines, and the third test lines are all disposed on the first metal layer.

In some embodiments, in the above array substrate provided according to the embodiments of the present disclosure, the test pads and the display pads respectively include a fifth portion, a sixth portion, and a seventh portion which are stacked and electrically connected to each other; orthographic projections of the fifth portion, the sixth portion, and the seventh portion on the base substrate are overlapped with each other, and the fifth portion, the sixth portion, and the seventh portion are electrically connected to each other through via holes provided in overlapping positions; the fifth portion is disposed on the first metal layer; the sixth portion is disposed on the second metal layer; and the seventh portion is disposed on the transparent conductive layer.

In another aspect, the embodiments of the present disclosure further provide a display panel, including any one of the array substrates provided as defined in the above aspect of the present disclosure, and further including a drive chip, wherein the drive chip is in bonding connection to the bonding region of the array substrate.

In another aspect, the embodiments of the present disclosure further provide a display device, including any one of the display panels provided as defined in the above aspect of the present disclosure.

DETAILED DESCRIPTION

Figure 1:
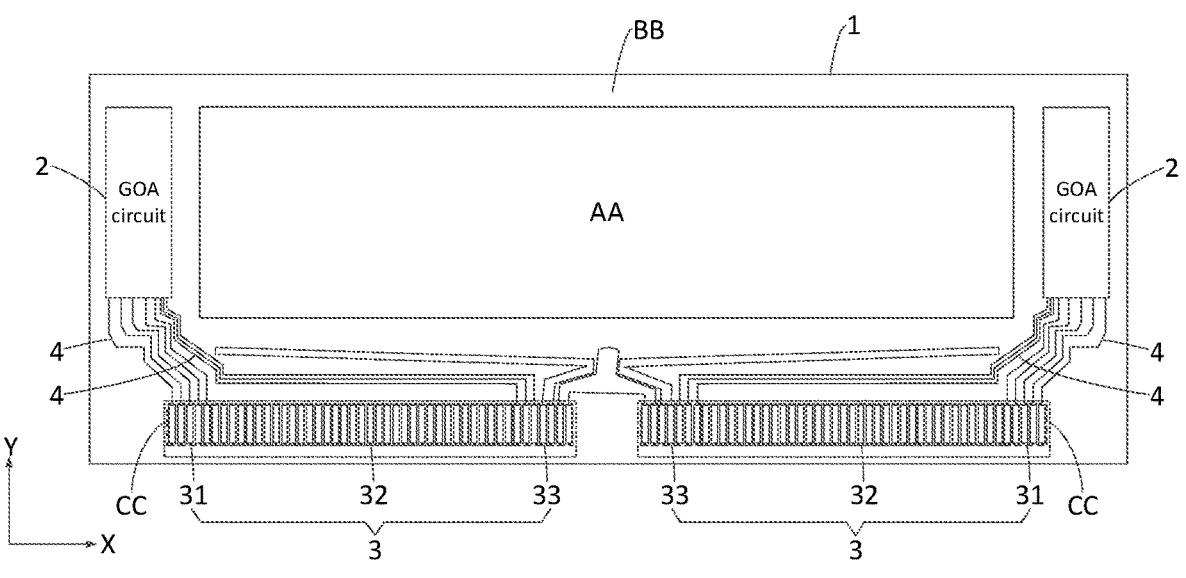
FIG. 1 is a schematic plan view of an array substrate according to some embodiments of the present disclosure.

For clearer descriptions of the objectives, technical solutions, and advantages of the embodiments of the present disclosure, the technical solutions in the embodiments of the present disclosure are clearly and completely described below with reference to the accompanying drawings of the embodiments of the present disclosure. Apparently, the described embodiments are merely some embodiments of the present disclosure, rather than all of the embodiments. Furthermore, the embodiments of the present disclosure and features in the embodiments may be mutually combined without conflicts. All other embodiments obtained by a person of ordinary skill in the art through the described embodiments of the present disclosure without making creative efforts shall fall within the protection scope of the present disclosure.

Unless otherwise defined, technical or scientific terms used in the present disclosure should have the ordinary meanings as understood by those of ordinary skill in the art to which the present disclosure belongs. "Include," "comprise," or other similar words mean that the elements or objects stated before them encompass the elements or objects and equivalents thereof listed after them, but do not exclude other elements or objects. "Connecting," "connected," or other similar words are not limited to physical or mechanical connections, but may include electrical connections, whether direct or indirect. "Inside," "outside," "upper," "lower," and the like are merely defined to indicate relative positional relationships. In the case that the absolute position of a described object changes, the relative positional relationships may also change accordingly.

It should be noted that the sizes and shapes of the various figures in the drawings are not to scale, and are merely intended to schematically illustrate the content of the present disclosure. Furthermore, the same or similar elements or the elements having the same or similar functions are denoted by the same or similar reference numerals throughout the description.

In the case that a display device is a display device with high pixels per inch (PPI), there are a large number of GOA signal lines and a large number of PLG wirings. To achieve a narrow frame, the distance between adjacent PLG lines needs to be reduced, and a bonding abnormality easily occurs in the case that the pitch of the PLG wirings is too small. Furthermore, in the case that the quantity of the PLG wirings increases, a quantity of GOA signal pads corresponding to a bonding region on an array substrate is large. In the case that an existing drive chip (IC) is adopted, as there is a limited number of GOA signal bonding pads on the existing IC, the GOA signal pads on the array substrate cannot be in bonding connection to the GOA signal bonding pads on the IC, such that an IC with the same GOA signal bonding pads needs to be matched. The cost is high in the case of redesigning and matching an IC of a high-resolution product. Therefore, how to avoid the bonding abnormality of the GOA signal lines and how to use the existing IC to achieve normal connection to the GOA signal lines of the high-resolution product are technical problems that need to be solved by those skilled in the art.

In view of this, the embodiments of the present disclosure provide an array substrate, as shown in FIG. 1, including:

a base substrate 1, including a display region AA and a non-display region BB surrounding the display region AA, wherein the non-display region BB is provided with a bonding region CC;

a gate drive circuit 2 (GOA circuit) disposed in the non-display region BB of the base substrate 1;

a plurality of display pads 3 disposed in the bonding region CC of the base substrate 1, wherein the plurality of display pads 3 and the gate drive circuit 2 are respectively disposed on adjacent sides of the base substrate 1; the plurality of display pads 3 include gate drive signal pads 31, data signal pads 32, and voltage signal pads 33 which are arranged in sequence in a first direction X pointing from one side of the gate drive circuit 2 to a side opposite to the gate drive circuit 2; and a plurality of gate connection wirings (PLG wirings) 4 disposed in the non-display region BB of the base substrate 1, wherein a quantity of the gate connection wirings 4 is greater than a quantity of the gate drive signal pads 31, wherein first ends of the gate connection wirings 4 are all electrically connected to the gate drive circuit 2, with second ends of one part of the gate connection wirings 4 (e.g., on a side distal from the display region AA) electrically connected to the gate drive signal pads 31 and second ends of another part of the gate connection wirings 4 (e.g., on a side proximal to the display region AA) electrically connected to the voltage signal pads 33.

Specifically, the display region generally includes insulated intersecting gate lines and data lines. The gate lines and the data lines define a plurality of pixel units. The output ends of the GOA circuit are electrically connected to the gate lines to output scanning signals to the gate lines line by line; the data lines are electrically connected to a drive chip; and the drive chip is configured to input data signals to the data lines. The GOA circuit generally includes GOA signal lines such as a CLK signal line, a VGL signal line, a VGH signal line, and an STV signal line. These GOA signal lines are electrically connected to the gate drive signal pads in the bonding region through the PLG wirings, and the gate drive signal pads are in bonding connection to GOA bonding pads on a side of the drive chip. The display region further includes VDD signal lines and VSS signal lines. For reduction of resistance, the VDD signal lines are connected entirely, and the VSS signal lines are also connected entirely, such that the VDD signal lines and the VSS signal lines do not need too many bonding pads. For a display product with high PPI, a part of the bonding pads of the VDD signal lines can be used as bonding pads for GOA signal lines. Therefore, in the case that the array substrate provided according to the embodiments of the present disclosure is an array substrate of a high-resolution product, the second ends of the one part of the gate connection wirings are electrically connected to the gate drive signal pads, namely, the gate drive signal pads are in one-to-one correspondence with the GOA signal bonding pads on the drive chip, and the second ends of the another part of the gate connection wirings (those not electrically connected to the gate drive signal pads) are electrically connected to the voltage signal pads (for example, bonding pads of the VDD signal lines). In this way, the normal connection of the GOA signal lines for high-resolution products can be realized with existing drive chip, and the cost of the drive chip is reduced. Furthermore, as the second ends of the another part of the gate connection wirings are electrically connected to the voltage signal pads, the distance between adjacent gate connection wirings does not need to be reduced, thus avoiding bonding abnormalities.

It should be noted that only a part of gate connection wirings (PLG wirings) 4 and a part of display pads 3 are illustrated in the array substrate shown in FIG. 1 of the embodiments of the present disclosure. The purpose is to illustrate that in the case that the quantity of the gate connection wirings (PLG wirings) 4 is greater than the quantity of the gate drive signal pads 31, the surplus gate connection wirings (PLG wirings) 4 jump to the right side of the bonding region CC to be electrically connected to the voltage signal pads 33.

In some embodiments, in the above array substrate provided according to the embodiments of the present disclosure, as shown in FIG. 1, the voltage signal pads 33 electrically connected to the second ends of the another part of the gate connection wirings 4 (proximal to the display region AA) are arranged immediately adjacent to the data signal pads 32. In this way, the another part of the gate connection wirings 4 and power lines (for example, VDD, VSS) electrically connected to the voltage signal pads 33 do not affect each other. Additionally, the voltage signal pads 33 electrically connected to the second ends of the another part of the gate connection wirings 4 and the data signal pads 32 are spaced apart from each other for electrically connecting to power lines (VDD, VSS) through the voltage signal pads 33, such that the another part of the gate connection wirings 4 and the power lines (VDD, VSS) overlap each other. Jumper wirings are required at the overlapping positions to prevent a short circuit. Therefore, in the embodiments of the present disclosure, the voltage signal pads 33 electrically connected to the second ends of the another part of the gate connection wirings 4 (proximal to the display region AA) are preferably arranged immediately adjacent to the data signal pads 32.

In some embodiments, in the above array substrate provided according to the embodiments of the present disclosure, as shown in FIG. 1, the display region AA includes data lines (not shown), sensing lines (not shown), first power lines (not shown), and second power lines (not shown). The data lines and the sensing lines are electrically connected to the data signal pads 32, respectively; the first power lines and the second power lines are electrically connected to the voltage signal pads 33; and the voltage signal pads 33 electrically connected to the first power lines and the second power lines are different from the voltage signal pads 33 electrically connected to the second ends of the another part of the gate connection wirings 4. Specifically, the first power lines are VDD lines, and the second power lines are VSS lines. As the first power lines VDD are entirely electrically connected, and the second power lines VSS are entirely electrically connected, the first power lines VDD and the second power lines VSS do not need to be electrically connected to too many voltage signal pads 33. In this way, the another part of the gate connection wirings 4 that cannot be electrically connected to the gate drive signal pads 31 use a part of the voltage signal pads 33, such that a high-PPI display product implements effective bonding connection using the existing drive chip, without the necessity of redesigning a new drive chip to match the high-PPI display product, thereby reducing the cost. Moreover, the another part of the gate connection wirings 4 jumping to be electrically connected to the voltage signal pads 33 allows for saving a certain amount of wiring space in the original region for the gate connection wirings 4. Therefore, the distance between adjacent wirings does not need to be reduced even under the condition that there are many gate connection wirings 4, achieving effective bonding between the drive chip and the array substrate.

Figure 2:
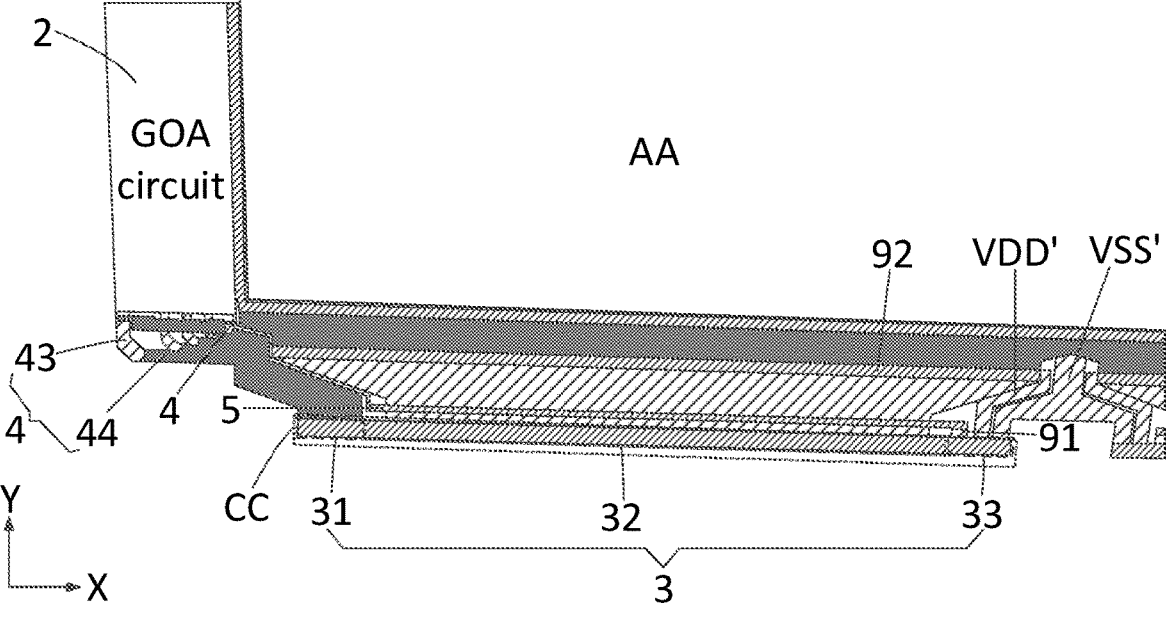
FIG. 2 is a schematic plan view of another array substrate according to some embodiments of the present disclosure.

In some embodiments, in the above array substrate provided according to the embodiments of the present disclosure, as shown in FIG. 2, which only shows a detailed film layer structure of a partial region in FIG. 1, the second ends of the another part of the gate connection wirings 4 are electrically connected to the voltage signal pads 33 through jumper wirings 5. The jumper wirings 5 extend along the first direction X, the jumper wirings 5 are disposed between the plurality of display pads 3 and the display region AA, and the jumper wirings 5 and the another part of the gate connection wirings 4 (proximal to the display region AA) are arranged in different layers in an insulation manner. Specifically, as the data lines and the sensing lines in the display region AA need to be led out from the display region AA to be electrically connected to the data signal pads 32 in the bonding region CC, several wirings are arranged between the bonding region CC and the display region AA. These wirings are generally disposed on a gate metal layer (Gate layer) and/or a source-drain metal layer (SD layer). The another part of the gate connection wirings 4 are also generally disposed on the gate metal layer and/or the source-drain metal layer, to prevent the another part of the gate connection wirings 4 from being short-circuited with the several wirings disposed between the bonding region CC and the display region AA, the another part of the gate connection wirings 4 need to jump to another metal layer, such as an anode layer.

Figures 3, 4:
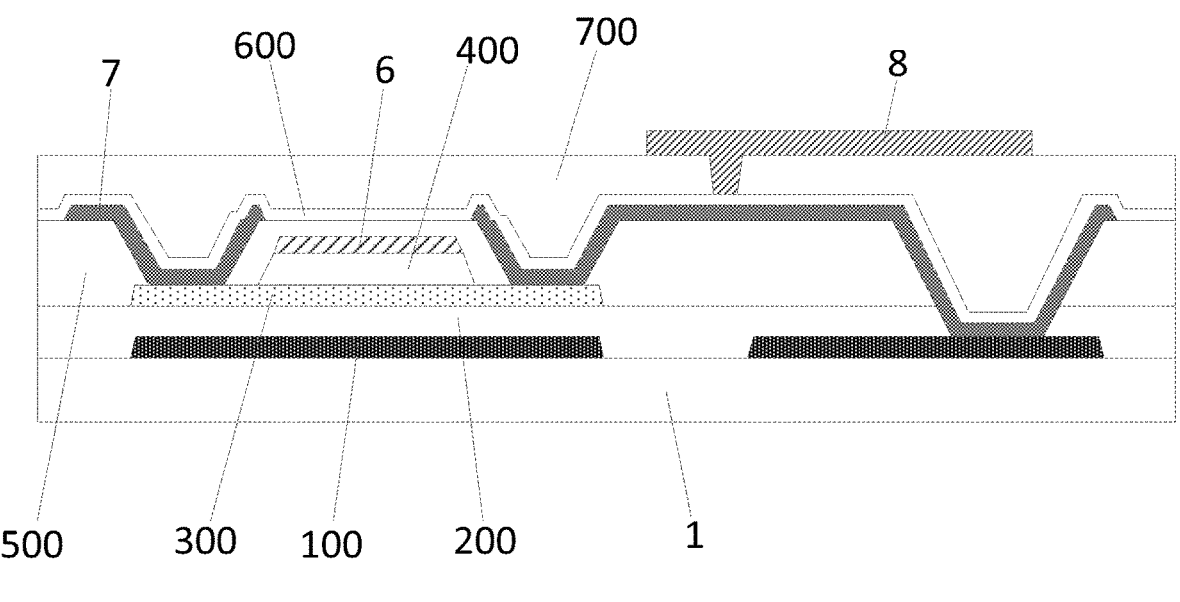
FIG. 3 is a partially schematic cross-sectional view of an array substrate according to some embodiments of the present disclosure.
FIG. 4 is a schematic diagram of another part of gate connection wirings.

In some embodiments, in the above array substrate provided according to the embodiments of the present disclosure, as shown in FIGS. 2 and 3, FIG. 3 is a partial sectional view of the array substrate, including a first metal layer 6 (for example, gate metal layer), a second metal layer 7 (for example, source-drain metal layer), and a transparent conductive layer 8 (for example, anode layer) which are stacked on the base substrate 1. The jumper wirings 5 are disposed on the transparent conductive layer 8.

The another part of the gate connection wirings 4 shown in FIG. 2 may be disposed on the first metal layer 6 shown in FIG. 3. Additionally, the another part of the gate connection wirings 4 may also be disposed on the second metal layer 7 shown in FIG. 3. According to the embodiment of the present disclosure in FIG. 2, the example shows that the another part of the gate connection wirings 4 are disposed on the first metal layer 6 shown in FIG. 3.

In some embodiments, to reduce RC loading generated by the another part of the gate connection wirings 4, so as to facilitate the improvement of the display quality, the another part of the gate connection wirings 4 shown in FIG. 2 also include a first portion 41 and a second portion 42 which are stacked. As shown in FIG. 4, an orthographic projection of the first portion 41 on the base substrate 1 is overlapped with an orthographic projection of the second portion 42 on the base substrate 1; the first portion 41 and the second portion 42 are electrically connected to each other through a via hole V1 provided in the overlapping position; the first portion 41 is disposed on the first metal layer 6 shown in FIG. 3; and the second portion 42 is disposed on the second metal layer 7 shown in FIG. 3.

Specifically, as shown in FIG. 3, the array substrate further includes a shading metal layer 100, a buffer layer 200, and an active layer 300 which are stacked in sequence between the first metal layer 6 and the base substrate 1, a gate insulation layer 400 disposed between the active layer 300 and the first metal layer 6, an interlayer dielectric layer 500 disposed between the first metal layer 6 and the second metal layer 7, a passivation layer 600 disposed between the second metal layer 7 and the transparent conductive layer 8, and a planarization layer 700 disposed between the passivation layer 600 and the transparent conductive layer 8.

In some embodiments, in the above array substrate provided according to the embodiments of the present disclosure, as shown in FIG. 2, one part of the gate connection wirings 4 (distal from the display region AA) are electrically connected to input signal lines (for example, the CLK signal line, the VGL signal line, the VGH signal line, and the STV signal line) of the gate drive circuit 2, and the another part of the gate connection wirings 4 (proximal to the display region AA) are electrically connected to the output ends (for electrically connecting to gate lines in the display region AA in a one-to-one correspondence) of the gate drive circuit 2. Specifically, to test whether the gate drive circuit 2 works properly, the signal from the output end of the gate drive circuit 2 is led out to the voltage signal pads 33 through the another part of the gate connection wirings 4 and the jumper wirings 5. In some embodiments of the present disclosure, the another part of the gate connection wirings 4 configured to be electrically connected to the output end of the gate drive circuit 2 are led out to be electrically connected to the voltage signal pads 33 through the jumper wirings 5. As the another part of the gate connection wirings 4 are electrically connected to a test signal, and the RC loading generated by the another part of the gate connection wirings 4 has no influence on displaying, the another part of the gate connection wirings 4 may employ a single-layer metal wiring. For example, the another part of the gate connection wirings 4 are only disposed on the first metal layer 6, such that the manufacturing process can be simplified.

It should be noted that in the embodiments of the present disclosure, the signal from the output end of the gate drive circuit 2 being led out to the voltage signal pads 33 by the another part of the gate connection wirings 4 is used as an example. However, this is not limited to this specific instance, it is also possible to lead a part of signal lines such as the CLK signal line, the VGL signal line, the VGH signal line, and the STV signal line out to be electrically connected to the voltage signal pads 33.

In some embodiments, in the above array substrate provided according to the embodiments of the present disclosure, as shown in FIG. 2, the jumper wirings 5 are electrically connected to the voltage signal pads 33 through first connection lines 91. The first connection lines 91 are disposed on the transparent conductive layer 8 shown in FIG. 3 or in the first metal layer 6 shown in FIG. 3. Specifically, the embodiments of the present disclosure take the first connection lines 91 being disposed on the first metal layer 6 shown in FIG. 3 as an example. As resistance of metal is less than resistance of the transparent conductive layer, arranging the first connection lines 91 in the first metal layer 6 can reduce resistance. The jumper wirings 5 and the first connection lines 91 need to be electrically connected to each other through via holes passing through the insulation layer.

In some embodiments, to reduce RC loading generated by the one part of the gate connection wirings 4 (distal from the display region AA) to facilitate the improvement of the display quality, in the array substrate provided according to the embodiments of the present disclosure, as shown in FIG. 2, the one part of the gate connection wirings 4 (distal from the display region AA) include a third portion 43 and a fourth portion 44 which are stacked; an orthographic projection of the third portion 43 on the base substrate 1 is overlapped with an orthographic projection of the fourth portion 44 on the base substrate 1; the third portion 43 and the fourth portion 44 are electrically connected to each other through a via hole V2 provided in the overlapping position; the third portion 43 is disposed on the first metal layer 6 shown in FIG. 3, and the fourth portion 44 is disposed on the second metal layer 7 shown in FIG. 3.

In some embodiments, in the array substrate provided according to the embodiments of the present disclosure, as shown in FIG. 2, the first power lines (VDD, not shown) are all electrically connected to second connection lines 92. The second connection lines 92 extend along the first direction X, the second connection lines 92 are disposed between the jumper wirings 5 and the display region AA, and the second connection lines 92 are disposed on the transparent conductive layer 8 shown in FIG. 3. In this way, the second connection lines 92 can be electrically connected to all the first power lines VDD in the entire display region AA, thereby reducing the resistance of the first power lines VDD and improving the display quality.

In some embodiments, in the array substrate provided according to the embodiments of the present disclosure, as shown in FIG. 2, the second power lines (VSS, not shown) are all electrically connected to third connection lines (not shown). The third connection lines extend along the first direction X, the third connection lines are disposed between the second connection lines 92 and the display region AA, and the connection lines 93 are disposed on the first metal layer 6 shown in FIG. 3. In this way, the third connection lines can be electrically connected to all the second power lines VSS in the entire display region AA, thereby reducing the resistance of the second power lines VSS and improving the display quality.

Specifically, as shown in FIG. 2, the second connection lines 92 are electrically connected to the voltage signal pads 33 through first leads VDD', and the third connection lines are electrically connected to the voltage signal pads 33 through second leads VSS'.

Figure 5:
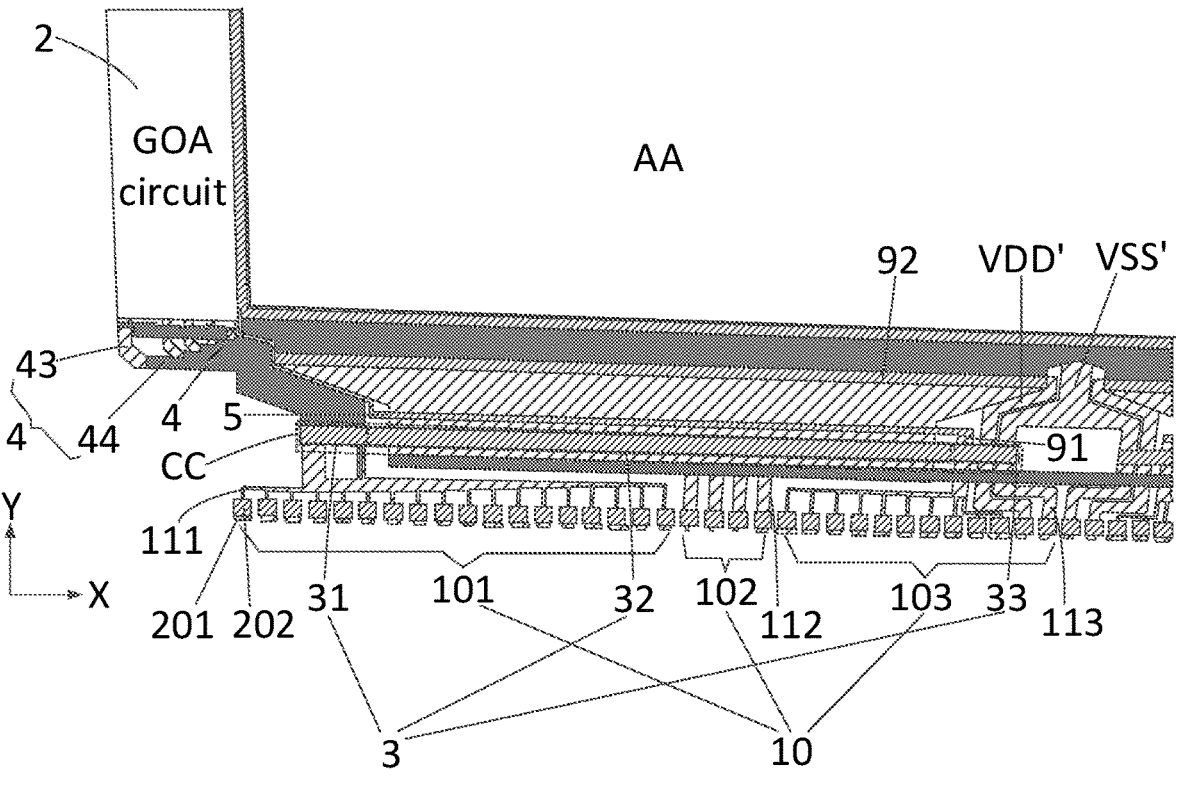
FIG. 5 is a schematic plan view of another array substrate according to some embodiments of the present disclosure.

In some embodiments, in the above array substrate provided according to the embodiments of the present disclosure, as shown in FIG. 5, the bonding region CC further includes a plurality of test pads 10 disposed on one side of the display pads 3 distal from the display region AA. The plurality of test pads 10 include gate drive signal test pads 101, data signal test pads 102, and voltage signal test pads 103 which are arranged in sequence in the first direction X.

The gate drive signal test pads 101 are electrically connected to the gate drive signal pads 31 through first test lines 111; the data signal test pads 102 are electrically connected to the data signal pads 32 through second test lines 112; and the voltage signal test pads 103 are electrically connected to the voltage signal pads 33 through third test lines 113. Specifically, the test pads 10 are configured to perform a CT after an array substrate process is completed to test whether the array substrate works properly.

In some embodiments, in the above array substrate provided according to the embodiments of the present disclosure, as shown in FIG. 5, the first test lines 111, the second test lines 112, and the third test lines 113 are all disposed on the first metal layer 6 (the gate metal layer) shown in FIG. 3. Alternatively, the first test lines 111, the second test lines 112, and the third test lines 113 are also all disposed on the second metal layer 7 (the gate metal layer) shown in FIG. 3. Alternatively, the first test lines 111, the second test lines 112, and the third test lines 113 employ a double-layer wiring with the first metal layer 6 (the gate metal layer) and the second metal layer 7 (the gate metal layer) as shown in FIG. 3.

In some embodiments, in the above array substrate provided according to the embodiments of the present disclosure, as shown in FIG. 5, the test pads 10 and the display pads 3 respectively include a fifth portion (not shown), a sixth portion 201, and a seventh portion 202 which are stacked and electrically connected to each other; orthographic projections of the fifth portion, the sixth portion 201, and the seventh portion 202 on the base substrate 1 are overlapped with each other, and the fifth portion, the sixth portion 201, and the seventh portion 202 are electrically connected to each other through via holes (not shown) formed in the overlapping positions; the fifth portion is disposed on the first metal layer 6 shown in FIG. 3, the sixth portion 201 is disposed on the second metal layer 7 shown in FIG. 3, and the seventh portion 202 is disposed on the transparent conductive layer 8 shown in FIG. 3. In this way, the test pads 10 and the display pads 3 are both electrically connected using the three metal layers, which reduces the resistance of the test pads 10 and the resistance of the display pads 3 and improves the display quality.

Based on the same inventive concept, the embodiments of the present disclosure further provide a display panel, including the above array substrate provided according to the embodiments of the present disclosure, and further including a drive chip. The drive chip is in bonding connection to the bonding region of the above array substrate provided according to the embodiments of the present disclosure.

Specifically, in the embodiments of the present disclosure, a chip on film (often referred to as COF, which is a chip on film mounting technology for fixing a source integrated circuit (drive chip) on a flexible circuit board) technology is adopted to bond both the display pads and the test pads on the array substrate to a COF.

It should be noted that, for a large-size display panel, one drive chip cannot meet a bonding requirement, such that generally at least two drive chips are used. The embodiments of the present disclosure take the array substrate being bonded to two drive chips as an example. That is, the array substrate is divided into two bonding regions. The two bonding regions are symmetrically arranged with respect to a center line of the array substrate, and two gate drive circuits are used for double-sided driving to reduce RC Loading. The two gate drive circuits are symmetrically arranged with respect to a center line of the array substrate.

Based on the same inventive concept, the embodiments of the present disclosure further provide a display device, including the above display panel provided according to the embodiments of the present disclosure. The display device may be any product or component with a display function, such as a mobile phone, a tablet computer, a television, a display, a notebook computer, a digital photo frame, and a navigator. The implementation of the display device can refer to the embodiments of the above array substrate, and repeated descriptions are omitted.

The embodiments of the present disclosure provide an array substrate, a display panel, and a display device. The second ends of one part of the gate connection wirings are electrically connected to the gate drive signal pads, namely, the gate drive signal pads are in one-to-one correspondence with the GOA signal bonding pads on the drive chip, and the second ends of the another part of the gate connection wirings (those wirings that are not electrically connected to the gate drive signal pads) are electrically connected to the voltage signal pads (for example, bonding pads of the VDD signal lines). In this way, normal connection of the GOA signal lines of the high-resolution product can be realized by using the existing drive chip, the cost of the drive chip is reduced. Furthermore, as the second ends of the another part of the gate connection wirings are electrically connected to the voltage signal pads, a distance between adjacent gate connection wirings does not need to be reduced, such that the problem of a bonding abnormality can be avoided.

Although the preferred embodiments of the present disclosure have been described, those skilled in the art may make additional changes and modifications to these embodiments once they have knowledge of the basic creative concept. Therefore, the attached claims are intended to be interpreted as including the preferred embodiments and all changes and modifications falling within the scope of the present disclosure.

It will be apparent to those skilled in the art that various changes and transformations can be made in the embodiments of the present disclosure without departing from the spirit and scope of the embodiments of the present disclosure. Thus, if these changes and transformations of the embodiments of the present disclosure are within the scope of the claims of the present disclosure and their equivalents, the present disclosure is also intended to encompass these changes and transformations.

What is claimed is:

1. An array substrate, comprising:

a base substrate, comprising a display region and a non-display region surrounding the display region, wherein the non-display region is provided with a bonding region;

a gate drive circuit disposed in the non-display region of the base substrate;

a plurality of display pads disposed in the bonding region of the base substrate, wherein the plurality of display pads and the gate drive circuit are respectively disposed on adjacent sides of the base substrate; the plurality of display pads comprise gate drive signal pads, data signal pads, and voltage signal pads which are arranged in sequence in a first direction pointing from one side of the gate drive circuit to a side opposite to the gate drive circuit; and a plurality of gate connection wirings disposed in the non-display region of the base substrate, wherein a quantity of the gate connection wirings is greater than a quantity of the gate drive signal pads, wherein first ends of the gate connection wirings are all electrically connected to the gate drive circuit, with second ends of one part of the gate connection wirings electrically connected to the gate drive signal pads and second ends of another part of the gate connection wirings electrically connected to the voltage signal pads.

2. The array substrate according to claim 1, wherein the voltage signal pads electrically connected to the second ends of the another part of the gate connection wirings are arranged immediately adjacent to the data signal pads.

3. The array substrate according to claim 2, wherein the display region comprises data lines, sensing lines, first power lines, and second power lines, wherein the data lines and the sensing lines are electrically connected to the data signal pads, respectively; the first power lines and the second power lines are electrically connected to the voltage signal pads; and the voltage signal pads electrically connected to the first power lines and the second power lines are different from the voltage signal pads electrically connected to the second ends of the another part of the gate connection wirings.

4. The array substrate according to claim 3, wherein the second ends of the another part of the gate connection wirings are electrically connected to the voltage signal pads through jumper wirings, wherein the jumper wirings extend along the first direction and are disposed between the plurality of display pads and the display region, and the jumper wirings and the another part of the gate connection wirings are arranged in different layers in an insulation manner.

5. The array substrate according to claim 4, comprising a first metal layer, a second metal layer, and a transparent conductive layer which are stacked on the base substrate, wherein the jumper wirings are disposed on the transparent conductive layer;

the another part of the gate connection wirings are disposed on the first metal layer or the second metal layer.

6. The array substrate according to claim 5, wherein the one part of the gate connection wirings are electrically connected to input signal lines of the gate drive circuit, and the another part of the gate connection wirings are electrically connected to output ends of the gate drive circuit.

7. The array substrate according to claim 5, wherein the jumper wirings are electrically connected to the voltage signal pads through first connection lines, wherein the first connection lines are disposed on the transparent conductive layer or in the first metal layer.

8. The array substrate according to claim 5, wherein the one part of the gate connection wirings comprise a third portion and a fourth portion which are stacked, wherein an orthographic projection of the third portion on the base substrate is overlapped with an orthographic projection of the fourth portion on the base substrate; the third portion and the fourth portion are electrically connected to each other through a via hole provided in an overlapping position; the third portion is disposed on the first metal layer, and the fourth portion is disposed on the second metal layer.

9. The array substrate according to claim 5, wherein the first power lines are all electrically connected to second connection lines, wherein the second connection lines extend along the first direction, are disposed between the jumper wirings and the display region, and are disposed on the transparent conductive layer.

10. The array substrate according to claim 9, wherein the second power lines are all electrically connected to third connection lines, wherein the third connection lines extend along the first direction, are disposed between the second connection lines and the display region, and are disposed on the first metal layer.

11. The array substrate according to claim 5, wherein the bonding region further comprises a plurality of test pads disposed on one side of the display pads distal from the display region, wherein the plurality of test pads comprise gate drive signal test pads, data signal test pads, and voltage signal test pads which are arranged in sequence in the first direction;

wherein the gate drive signal test pads are electrically connected to the gate drive signal pads through first test lines; the data signal test pads are electrically connected to the data signal pads through second test lines; and the voltage signal test pads are electrically connected to the voltage signal pads through third test lines.

12. The array substrate according to claim 11, wherein the first test lines, the second test lines, and the third test lines are all disposed on the first metal layer.

13. The array substrate according to claim 11, wherein the test pads and the display pads respectively comprise a fifth portion, a sixth portion, and a seventh portion which are stacked and electrically connected to each other, wherein orthographic projections of the fifth portion, the sixth portion, and the seventh portion on the base substrate are overlapped with each other; the fifth portion, the sixth portion, and the seventh portion are electrically connected to each other through via holes provided in overlapping positions; the fifth portion is disposed on the first metal layer, the sixth portion is disposed on the second metal layer, and the seventh portion is disposed on the transparent conductive layer.

14. A display panel, comprising an array substrate as defined in claim 1 and a drive chip, wherein the drive chip is in bonding connection to the bonding region of the array substrate; and the array substrate comprises:

a base substrate, comprising a display region and a non-display region surrounding the display region, wherein the non-display region is provided with a bonding region;

a gate drive circuit disposed in the non-display region of the base substrate;

a plurality of display pads disposed in the bonding region of the base substrate, wherein the plurality of display pads and the gate drive circuit are respectively disposed on adjacent sides of the base substrate; the plurality of display pads comprise gate drive signal pads, data signal pads, and voltage signal pads which are arranged in sequence in a first direction pointing from one side of the gate drive circuit to a side opposite to the gate drive circuit; and a plurality of gate connection wirings disposed in the non-display region of the base substrate, wherein a quantity of the gate connection wirings is greater than a quantity of the gate drive signal pads, wherein first ends of the gate connection wirings are all electrically connected to the gate drive circuit, with second ends of one part of the gate connection wirings electrically connected to the gate drive signal pads and second ends of another part of the gate connection wirings electrically connected to the voltage signal pads.

15. A display device, comprising the display panel as defined in claim 14.

16. The array substrate according to claim 4, comprising a first metal layer, a second metal layer, and a transparent conductive layer which are stacked on the base substrate, wherein the jumper wirings are disposed on the transparent conductive layer;

the another part of the gate connection wirings comprise a first portion and a second portion which are stacked, wherein an orthographic projection of the first portion on the base substrate is overlapped with an orthographic projection of the second portion on the base substrate; the first portion and the second portion are electrically connected to each other through a via hole provided in an overlapping position; the first portion is disposed on the first metal layer, and the second portion is disposed on the second metal layer.

17. The display panel according to claim 14, wherein the voltage signal pads electrically connected to the second ends of the another part of the gate connection wirings are arranged immediately adjacent to the data signal pads.

18. The display panel according to claim 17, wherein the display region comprises data lines, sensing lines, first power lines, and second power lines, wherein the data lines and the sensing lines are electrically connected to the data signal pads, respectively; the first power lines and the second power lines are electrically connected to the voltage signal pads; and the voltage signal pads electrically connected to the first power lines and the second power lines are different from the voltage signal pads electrically connected to the second ends of the another part of the gate connection wirings.

19. The display panel according to claim 18, wherein the second ends of the another part of the gate connection wirings are electrically connected to the voltage signal pads through jumper wirings, wherein the jumper wirings extend along the first direction and are disposed between the plurality of display pads and the display region, and the jumper wirings and the another part of the gate connection wirings are arranged in different layers in an insulation manner.

20. The display panel according to claim 19, comprising a first metal layer, a second metal layer, and a transparent conductive layer which are stacked on the base substrate, wherein the jumper wirings are disposed on the transparent conductive layer;

the another part of the gate connection wirings are disposed on the first metal layer or the second metal layer.

* * * * *